(12) United States Patent
Horning et al.

(10) Patent No.: US 7,112,463 B2
(45) Date of Patent: Sep. 26, 2006

(54) METHOD FOR MAKING DEVICES USING INK JET PRINTING

(75) Inventors: Robert Horning, Savage, MN (US); Thomas Ohnstein, Roseville, MN (US); Daniel Youngner, Maple Grove, MN (US)

(73) Assignee: Honeywell International Inc., Morristown, NJ (US)

( * ) Notice: Subject to any disclaimer, the term of this patent is extended or adjusted under 35 U.S.C. 154(b) by 257 days.

(21) Appl. No.: 10/713,329

(22) Filed: Nov. 13, 2003

(65) Prior Publication Data

US 2005/0104911 A1 May 19, 2005

(51) Int. Cl.
    *H01L 21/00* (2006.01)
(52) U.S. Cl. ......................................... 438/52; 438/50
(58) Field of Classification Search ................. 438/50, 438/52
    See application file for complete search history.

(56) References Cited

U.S. PATENT DOCUMENTS

| | | | |
|---|---|---|---|
| 6,120,588 A | 9/2000 | Jacobson | |
| 6,184,608 B1 | 2/2001 | Cabuz et al. | |
| 6,233,088 B1 | 5/2001 | Roberson et al. | |
| 6,255,758 B1 | 7/2001 | Cabuz et al. | |
| 6,371,610 B1 * | 4/2002 | Nakamura et al. | 347/101 |
| 6,401,001 B1 | 6/2002 | Jang et al. | |
| 6,402,403 B1 * | 6/2002 | Speakman | 400/120.03 |
| 6,411,013 B1 | 6/2002 | Horning | |
| 6,439,728 B1 | 8/2002 | Copeland | |
| 6,468,638 B1 | 10/2002 | Jacobsen et al. | |
| 6,503,831 B1 | 1/2003 | Speakman | |
| 6,506,438 B1 | 1/2003 | Duthaler et al. | |
| 2002/0050769 A1 | 5/2002 | Pelrine et al. | |
| 2003/0095319 A1 | 5/2003 | Buzzetta | |

OTHER PUBLICATIONS

Motamedi et al., "Micro-opt-electro-mechanical devices and on-chip optical processing," Optical Engineering, vol. 36, No. 5, pp. 1282-1297, May 1997.
Chang et al, "A Novel Addressable Switching Micro Corner Cube Array For Free-Space Optical Applications," IEEE, International Micro Electro Mechanical Systems Conference, New York, NY, pp. 279-282, Jan. 2003.
Filler, Sawyer B., et al. "Ink-Jet Printed Nanoparticle Microelectromechanical Systems", Journal of Microelectromechanical Systems, vol. 11, No. 1, pp. 54-60 Feb. 2002.
Xerox Technology—Microelectromechanical Systems—MEMSjet, www.xipo.com.
Beeson et al., "Thermal inkjet technology-review and outlook," Hewlett Packard Company, 6 pages, printed prior to filing date.
Beeson, "Thermal Inkjet: Meeting the Applications Challenge," Hewlett Packard Company, 4 pages, printed prior to filing date.
Benett et al., "Precision Industrial Ink Jet Printing Technology for Full Color PLED Display and TFT-LCD Manufacturing," 3 pages printed, printed prior to filing date.

(Continued)

*Primary Examiner*—Bradley K. Smith
(74) *Attorney, Agent, or Firm*—Fogg and Associates LLC; David N. Fogg

(57) ABSTRACT

Methods for using ink-jet printing to deposit various layers of micro-structure devices are provided. A wide variety of micro-structures may be formed using these techniques including, for example, many forms of MEMs structures as well as other structures.

20 Claims, 11 Drawing Sheets

OTHER PUBLICATIONS

Calvert et al., "Multilayer Inkjet Printing of Biopolymers, OLED's and Other Devices," 5 pages, printed prior to filing date.

Calvert, "Inkjet Printing for Materials and Device," American Chemical Soicety, pp. 3299-3305, 2001.

Cooley et al., "Applications of Ink-Jet Printing Technology to BioMEMS and Microfluidic Systems," JALA vol. 7 No. 5, pp. 33-39, Oct./Nov. 2002.

Cox et al., "Microjet Printing of Micro-Optical Interconnects," Int. J. Microcircuits & Elect. Packaging vol. 23 No. 3, pp. 1-7, 2000.

Cox et al., "Micro-jet Printing of Refractive Microlenses," OSA Diffractive Optics and Micro-Optics Topical Meeting, 4 pages, Jun. 1998.

Cox et al., "Micro-Optics Fabrication by Ink-Jet Printing," Optics & Photonics News, p. 32-35, Jun. 2001.

Friend, "Plastic Electronics,",10 pages. Printed Feb. 2004.

Grove et al., "Color Flat Panel Manufacturing Using Ink Jet Technology," MicroFab Technologies, Inc., pp. 1-4, 1999.

Hayes et al., "Applications of Ink Jet Technology to Microelectronic Packaging," ISHM '89, pp. 627-634, 1989.

Hayes et al., "Low-Cost Display Assembly and Interconnect Using Ink-Jet Printing Technology," MicroFab Technologies, Inc., pp. 1-4, 1999.

Hayes et al., "Micro-Jet Printing of Polymers and Solder for Electronics Manufacturing," Journal of Electronic Manufacturing, vol. 8, Nos. 3 & 4, pp. 209-216, Sep. & Dec. 1998.

Hayes et al., "Printing System for MEMS Packaging," Proceedings, SPIE Conference on Micromachining and Microfabrication, pp. 1-9, Oct. 2001.

Hebner et al., "Ink-jet printing of doped polymers for organic light emitting devices," American Institute of Physics vol. 72, No. 5, pp. 519-521 Feb. 2, 1998.

http://www.smalltimes.com, Small Times: News about MEMS, Nanotechnology and Microsystems, Smalltimes, pp. 1-3, Printed Feb. 18, 2004.

MacFarlane et al., "Mircojet Fabrication of Microlens Arrays," IEEE Photonics Technology Letters vol. 6 No. 9, pp. 1112-1114, Sep. 1994.

Mattill, "Print Your Next PC," M I T Technogly Review, 5 pages, 2000.

Molesa et al., "High-quality inkjet-printed multilevel interconnects and inductive components on plastic for ultra-low-cost RFID Applications," Mat.Res.Soc.Symp.Proc. vol. 769, pp. H.8.3.1-H.8.3.6, 2003.

Paul et al., "Effective Jet Printing of Organic Semiconducting Polymers," Mat.Res. Soc. Symp. Proc. vol. 769, pp. 151-156, 2003.

Ready et al., "Jet Printing for Large Area Electronics," IS&T's NIP18, pp. 429-432, 2002.

Scott, "Flexible Displays & Electronics Workshop Case Study-Ink Jet Printing," Patterning Technologies Limited, 3 pages, Apr. 8, 2003.

Shah et al., "Fabrication of Passive Elements using Ink-Jet Technology," IMAPS ATW on Passive Integration, pp. 1-6, Jun. 2002.

Shah et al., "Trimming and Printing of Embedded Resistors Using Demand-Mode Ink-Jet Technology and Conductive Polymer," MicroFab Technologies, Inc., pp. 1-5, 2002.

Wallace, "Automated Electronic Circuit Manufacturing Using Ink-Jet Technology," Journal of Electronic Packaging, vol. 111, pp. 108-111, Jun. 1989.

Wong et al., "Amorphous silicon thin-film transistors and arrays fabricated by jet printing," Applied Physic Letters, vol. 80 No. 4, pp. 610-612, Jan. 28, 2002.

Wong et al., "Jet-printed fabrication of a-Si:H thin-film transistors and arrays," Journal of Non-Crystalline Solids, pp. 1335-1339, 2002.

www.plasticlogic.com, "Plastic Logic Technology Tour," Plastic Logic Limited, 5 pages, printed prior to filing date.

* cited by examiner

METHOD FOR MAKING DEVICES USING INK JET PRINTING

FIELD

The present invention relates to the fabrication of micro-structures, and more particularly, to methods for making micro-structures using ink-jet printing.

BACKGROUND

Much of the time and effort expended in fabricating micro-devices often involves the deposition and patterning of various materials and layers that eventually form a three-dimensional structure. In many cases, the various layers and materials are deposited and patterned using conventional integrated circuit processing equipment, which can be expensive to purchase and maintain. In many cases, each layer may require the use of different equipment, which can significantly add to the expense in terms of increased production time, increased risk of contamination and/or mistakes, and reduced yields.

SUMMARY

The present invention is directed at using ink-jet printing to deposit various layers of a micro-structure, which can significantly reduce the cost and time for fabricating such structures. It is contemplated that a wide variety of micro-structures may be formed using the methods disclosed herein including, for example, many forms of Micro-Electro-Mechanical Systems (MEMS) structures as well as other structures.

In one illustrative embodiment, a micro-structure having an opening or cavity therein is provided. In this illustrative embodiment, a first layer is provided by ink-jet printing, followed by ink-jet printing a sacrificial layer. A second layer is then provided above the sacrificial layer, also by ink-jet printing. The sacrificial layer may then be removed to create an open space or cavity within the micro-structure.

In some embodiment, the first layer, the sacrificial layer and/or the second layer may be patterned, as desired. For example, the sacrificial layer may be deposited in a pattern that includes a number of sacrificial layer regions, where adjacent sacrificial layer regions are separated by gaps. The first layer may be secured to the second layer in the gaps. One illustrative MEMs type device that may be formed in this manner is an electrostatic actuator. To form the illustrative electrostatic actuator, an electrode layer followed by a dielectric layer may be ink-jet printed on or above the first layer, prior to providing the sacrificial layer. Likewise, a dielectric layer and another electrode layer may be ink-jet printed above the sacrificial layer, before the second layer is provided. After the sacrificial layer is removed, the resulting open space between the dielectric layers may allow the first layer/first electrode layer/second dielectric layer to flex away from the second layer/second electrode/second dielectric layer when subject to an expanding force. When a sufficient voltage is applied between the first and second electrode layers, an electrostatic force may be generated between the electrode layers that pulls the first electrode towards the second electrode, thus providing mechanical actuation. The dielectric layers may help prevent the first and second electrode layers from shorting when brought together.

It is contemplated that a number of sensors may be provided to detect when the electrodes are brought together and when they are spaced apart. These sensors may be provided in any number of ways, including for example, by ink-jet printing. Other devices, such as transistors, resistors, capacitors, inductors and related circuits may also be printed, as desired, and may be used in conjunction with the micro-structures discussed herein.

In some embodiments, more than one ink-jet print head may be used to deposit the various materials and/or layers of a desired micro-structure. In one example, one size or type of ink-jet print head may be used to deposit one material, while another size or type of ink-jet print head may be used to deposit another material. Likewise, since thicker layers may require more material to be deposited at a given location than thinner layers, a larger nozzle ink-jet print head may be used to deposit the thicker layers and a smaller nozzle ink-jet print head may be used to deposit the thinner layers. Also, a smaller nozzle ink-jet print head may be used to deposit layers that include smaller feature sizes, to achieve better resolution. For dielectric layers, an ink jet print head that minimizes pin holes may be desirable. Also, a printing pattern that has significant dot-to-dot overlap may be desirable, particularly when the dielectric layer must function as an electric insulator.

In some embodiments, each ink-jet head is included in a separate ink-jet cartridge. In other embodiments, more than one ink-jet head may be included in a single ink-jet cartridge, as desired. If more than one ink-jet head is provided in an ink-jet cartridge, multiple reservoirs may be provided. Each reservoir may contain a different printable material, as appropriate.

In some embodiments, multiple ink-jet heads are used sequentially to deposit the various materials and/or layers of a micro-structure, while in other embodiments, multiple ink-jet heads are used simultaneously. When multiple ink-jet head are used simultaneously, the material deposited by one ink-jet head preferably does not overlap the material just deposited by another ink-jet head, as some time may be required for the "ink" to dry. However, this is not required in all embodiments.

DETAILED DESCRIPTION

The following detailed description should be read with reference to the drawings. The drawings, which are not necessarily to scale, depict illustrative embodiments and are not intended to limit the scope of the invention.

Figure 1:
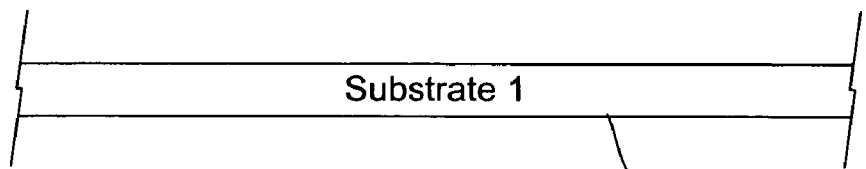
FIGS. 1–12 show in cross section an illustrative ink-jet printing method for fabricating an electrostatic actuator array.

FIGS. 1–12 show in cross-section an illustrative ink-jet printing method for fabricating a device including the use of a patterned sacrificial layer. As shown in FIG. 1, the process begins with a substrate 10. Any suitable material may be used for the substrate 10 including, for example, polymers, plastics, silicon or other semiconductors and semiconductor alloys, glass, metals, etc.

Figure 2:
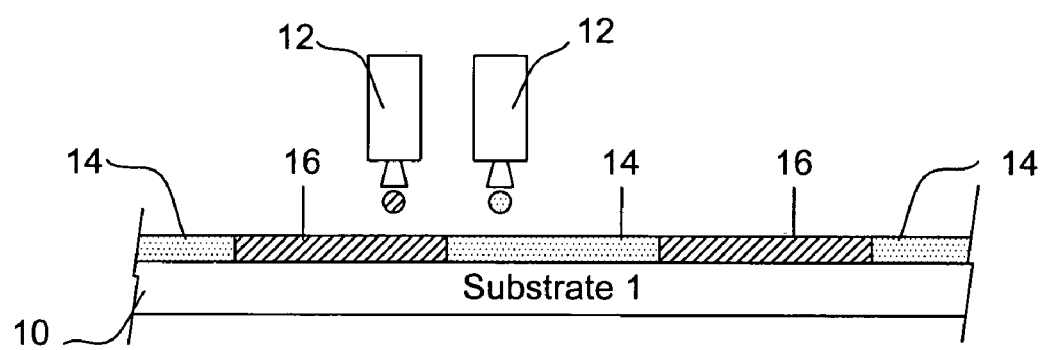

As shown in FIG. 2, one or more ink-jet printing heads 12 then deposit in a predetermined pattern a sacrificial layer 14 and a device layer 16. In the illustrative embodiment, the sacrificial layer 14 and the device layer 16 are only applied to the desired regions, and no subtractive type process is used to remove unwanted regions in the gaps therebetween. However, in some embodiments, a subtractive process may be used to form the patterned sacrificial layer 14 and the patterned device layer 16, if desired.

In some cases, the multiple ink-jet printing heads 12 are used simultaneously to provide the patterned sacrificial layer 14 and a patterned device layer 16. For example, when the patterned sacrificial layer 14 and the patterned device layer 16 have different properties (i.e. the materials have different viscosities or are created using suspensions of different size particles), different ink-jet printing heads 12 may be used to dispense the different materials. Also, the use of two or more ink-jet printing heads 12 may allow for faster placement of thick layers of material. In some cases, multiple ink-jet printing heads 12 may be operated sequentially, while in other cases simultaneously, as desired. In some embodiments, only a single ink-jet print head may be used.

In some embodiments, each ink-jet head is included in a separate ink-jet cartridge. In other embodiments, more than one ink-jet head may be included in a single ink-jet cartridge, as desired. If more than one ink-jet head is provided in an ink-jet cartridge, multiple reservoirs may be provided. Each reservoir may contain a different printable material, as appropriate.

Figure 3:
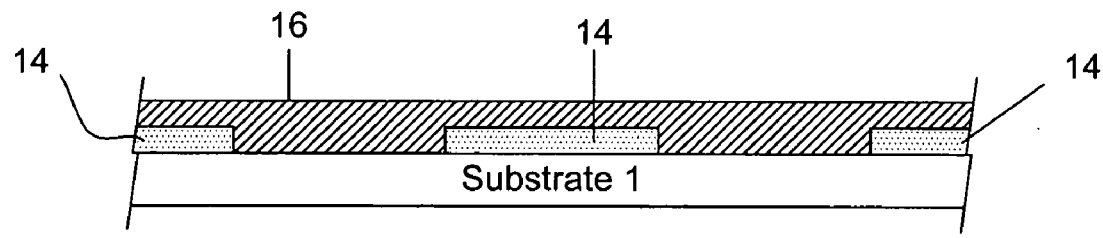
Figure 4:
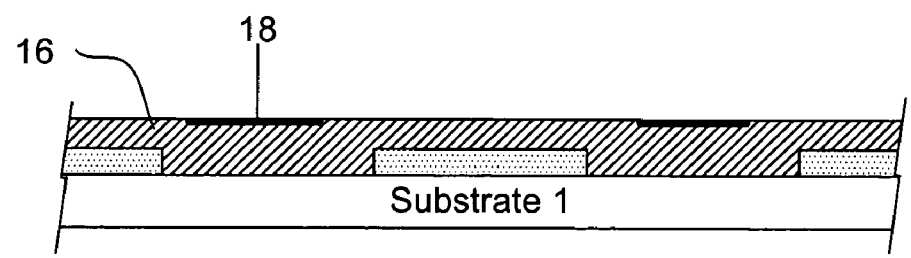
Figure 5:
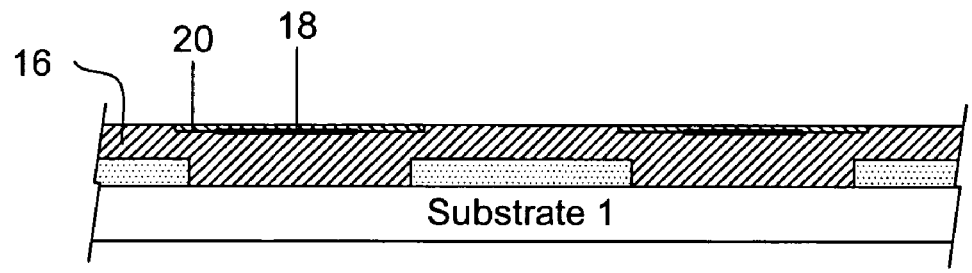

FIG. 3 shows a continuation of the illustrative process of FIG. 2, with additional material added to the patterned device layer 16 and over the top of the patterned sacrificial layer 14. FIG. 4 further continues the process from FIG. 3, where patterned conductive layer 18 are printed over selected regions of the patterned device layer 16. The patterned device layer 16 and the patterned conductive layer 18 may be printed simultaneously to shorten the time required to deposit the layers, if desired. Next, and as shown in FIG. 5, a patterned dielectric layer 20 may be provided over the patterned conductive layer 18. In some embodiments, the patterned device layer 16 may also be thickened to provide a relatively planar top surface, if desired.

Figure 6:
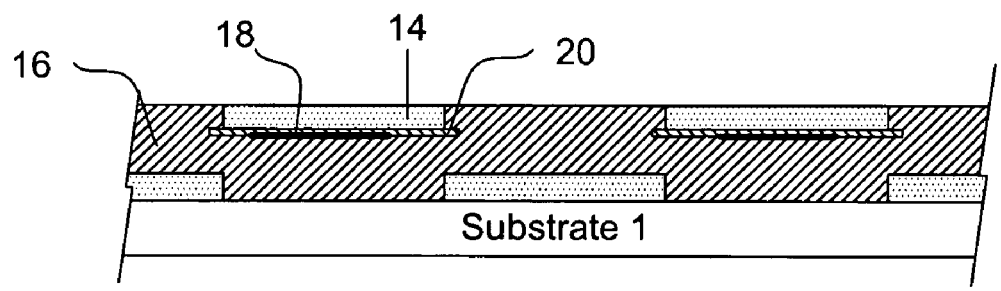
Figure 7:
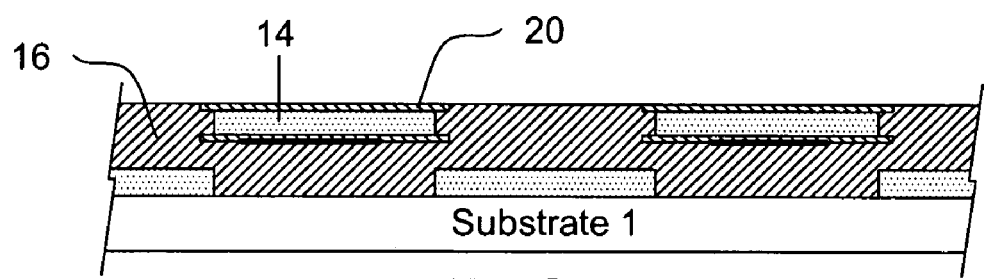
Figure 8:
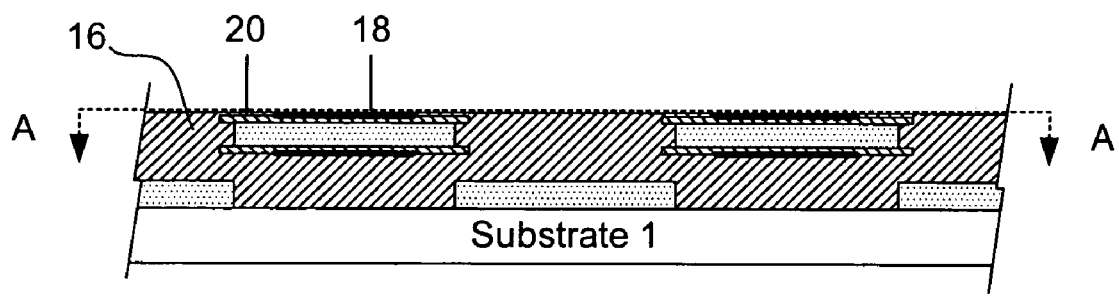

In FIG. 6, another patterned sacrificial layer 14 is printed along with additional material for the patterned device layer 16, with the patterned sacrificial layer 14 printed over a portion of the patterned dielectric 20. In FIG. 7, another patterned dielectric layer 20 is printed in the regions shown, along with more of the patterned device layer 16. In FIG. 8, another patterned conductive layer 18 is printed over a portion of the patterned dielectric layer 20, such that the patterned conductive layers 18, lined with the patterned dielectric layers 20, are positioned on either side of the patterned sacrificial layer 14 as shown. An illustrative shape or pattern for the patterned conductive layers 18 as well as the patterned dielectric layers 20 is shown and described further with respect to FIG. 14 below.

Figure 9:
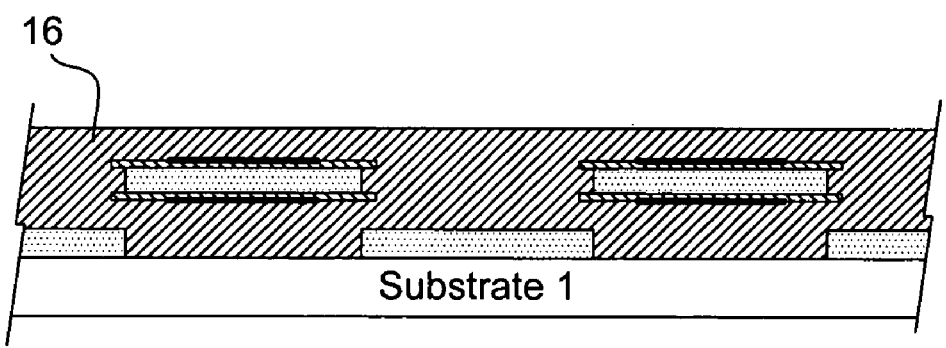
Figure 10:
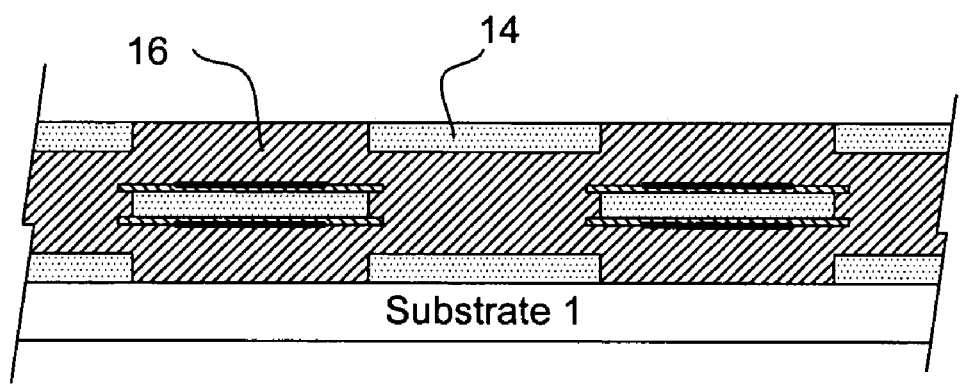
Figure 11:
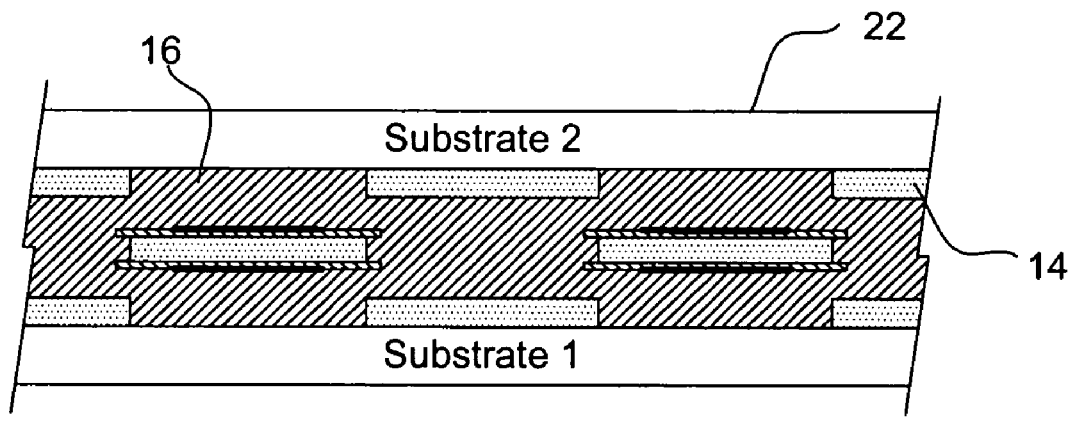

FIG. 9 illustrates the addition of more material to the patterned device layer 16. FIG. 10 shows the addition of another patterned sacrificial layer 14 along with more material added to the patterned device layer 16. In the illustrative embodiment, a second substrate 22 is then added in FIG. 11. The second substrate 22 may be printed, grown, or separately provided and attached by an adhesive or the like, as desired.

Figure 12:
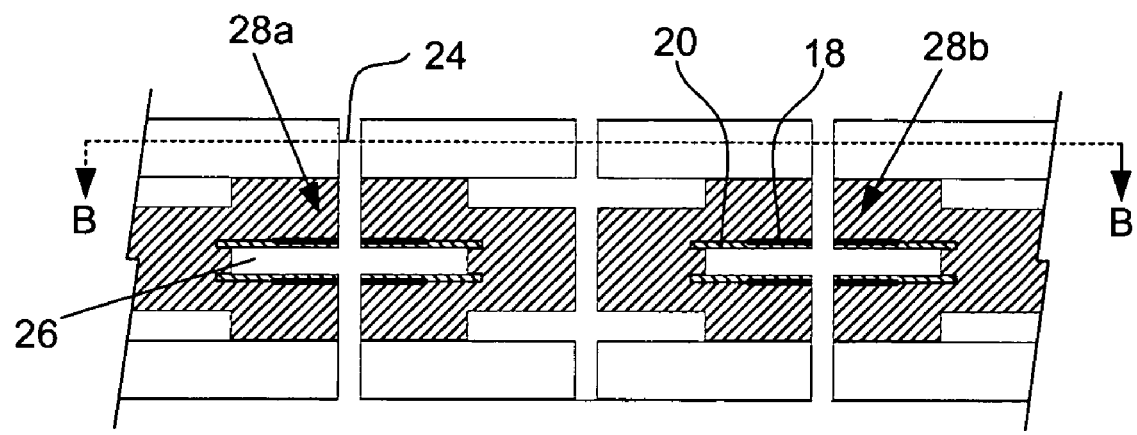

In the illustrative embodiment, and as shown in FIG. 12, several through holes 24 may then be created by laser ablation, drilling or any other suitable process. The patterned sacrificial layers 14 may then be removed by a subtractive process to create openings or voids.

In the illustrative embodiment, two electrostatic actuator unit cells 28a and 28b are formed by the openings or voids created by the removal of the patterned sacrificial material. Each electrostatic actuator cell 28a and 28b includes a pair of electrodes formed by the pattern conductive layers 18, and the electrodes are separated by a void as well as the patterned dielectric layers 20. The placement of several through holes within the device is further illustrated by the overhead view shown in FIG. 13.

Figure 13:
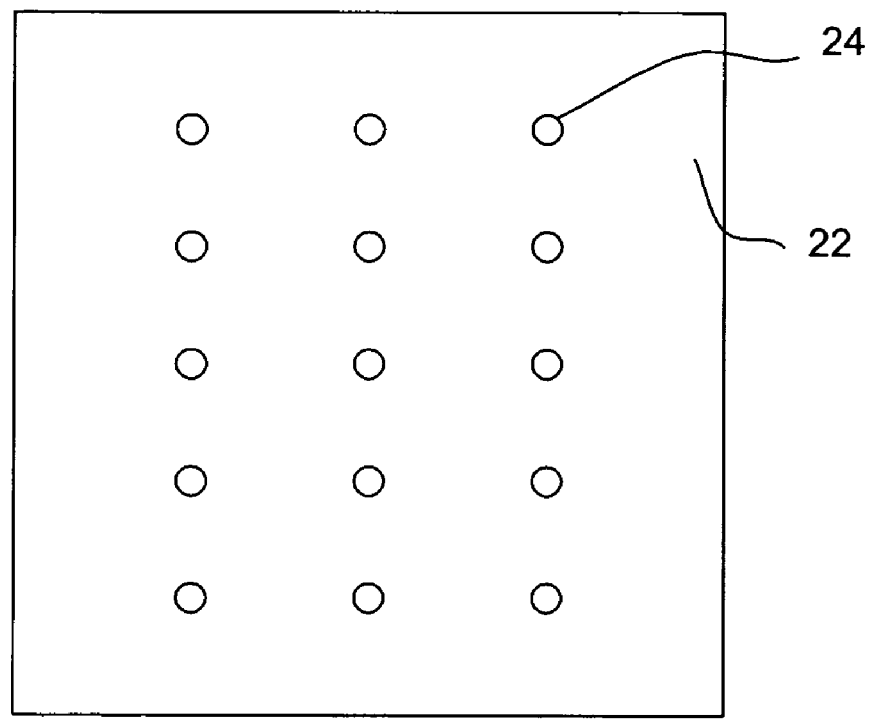
FIGS. 13–14 show top views for a device fabricated using the method illustrated in FIGS. 1–12.
Figure 14:
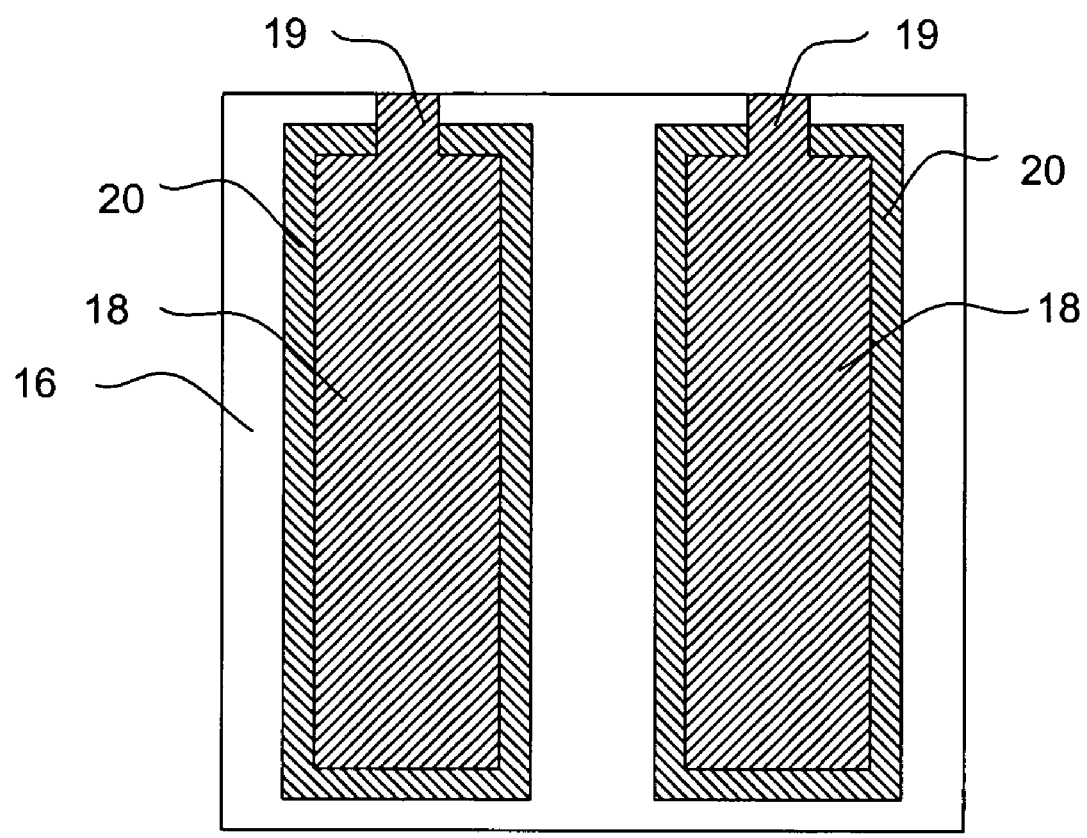

FIG. 13 is a top view of the electrostatic actuator array of FIG. 12 taken along line B—B. A number of through holes 24 are shown at locations that intersect the sacrificial layers 14. FIG. 14 is an elevation view taken along line A—A of FIG. 8. In the illustrative embodiment of FIG. 14, each cell is relatively long, though other configurations and shapes may be used, depending on the application. Patterned conductive leads 19 may also be printed, if desired. The patterned conductive leads 19 may, for example, extend from the patterned conductive layers (e.g. electrodes) to conductive leads of other actuator cells on the same or different layers, and/or to the edge of the substrate or some other location for coupling to one or more control lines, for example. If desired, the patterned conductive leads 19 may also be printed "vertically" through through-holes (not shown) to connect to buried electrodes, and/or to provide VIAS for multi-layer interconnect.

For the illustrative process of FIGS. 1–12, the patterned device layer 16 is preferably flexible enough so that when the substrates 10 and 22 are pulled apart by an external force, the openings formed by the removal of the patterned sacrificial layer expand. In the illustrative embodiment, traces may be printed going to or from the conductive members 18, such that a voltage differential may be applied between the two conductive members 18 of each of the electrostatic actuator cells 28a and 28b. When a voltage is applied, an attractive electrostatic force may be created between the corresponding conductive members 18, thereby pulling the conductive members 18 toward one another and closing the corresponding electrostatic actuator cell 28a and 28b. This is further illustrated below with reference to FIGS. 17–19.

Figure 15:
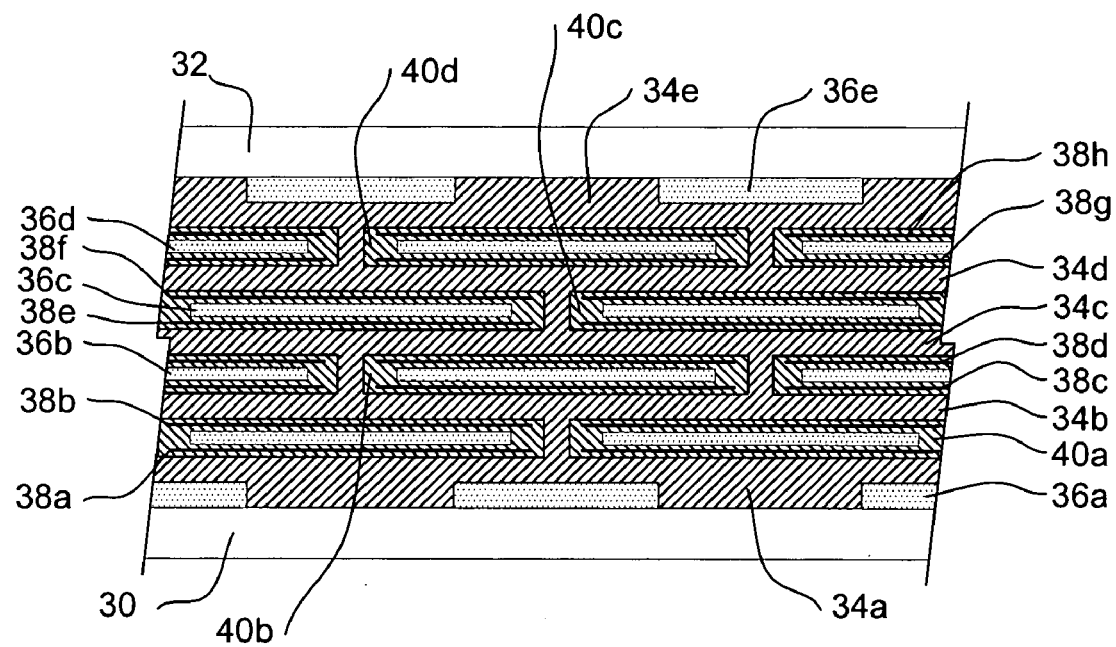
FIGS. 15–16 show in cross section another illustrative ink-jet printing method for fabricating an electrostatic actuator array.
Figure 16:
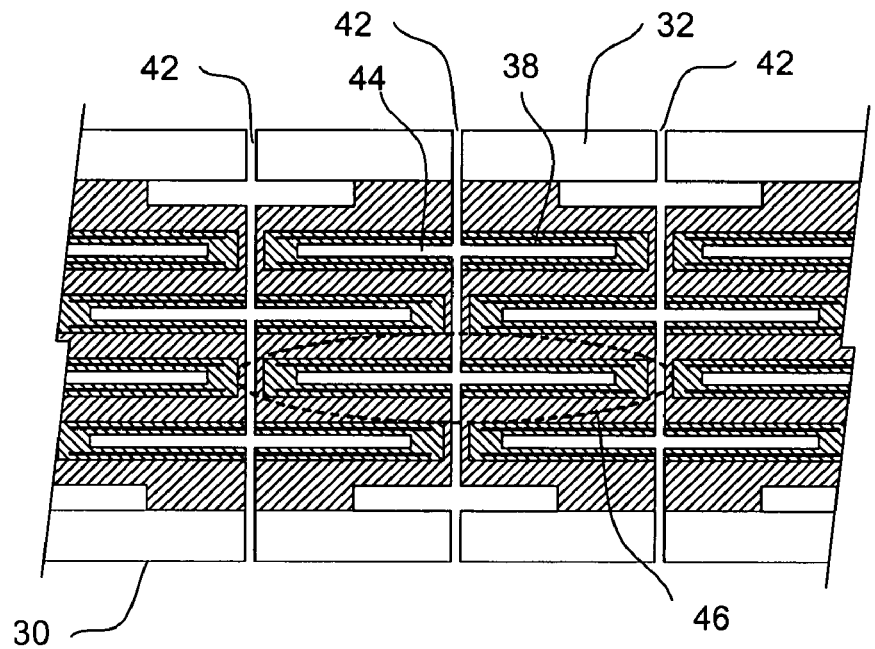

FIGS. 15–16 show another schematic cross-sectional view of an illustrative ink-jet printing method for fabricating a micro-structure, and more specifically, an illustrative three-dimensional array of electrostatic actuator cells. As shown in FIG. 15, several layers have been printed between a first substrate 30 and a second substrate 32. Included are a patterned device layer generally shown at 34a–34e, patterned sacrificial layers generally shown at 36a–36e, patterned conductive layers generally shown at 38a–38h, and patterned dielectric layers generally shown at 40a–40d. The patterned dielectric layers 40a–40d are shown as one layer, but preferably each patterned dielectric layer 40a–40d may each include two or more layers. As can be seen, the layers are patterned and printed in a three-dimensional fashion to construct a three-dimensional array of electrostatic actuators, similar to that described above with respect to FIGS. 1–14, but with more unit cells in a vertical direction.

FIG. 16 shows the addition of several through holes 42 that are created using laser ablation or any other suitable process. The through holes 42 are shown piercing all of the various layers shown in FIG. 15 including both substrates 30 and 32. In some embodiments, neither substrate 30 and 32 is pierced by the through holes, but rather the through holes 42 are provided before adding the first and/or second substrates 30 and 32. In any event, and in the illustrative embodiment, the patterned sacrificial layers 40a–40d are selectively removed through the through holes 42 using any suitable process, such as a subtractive process. The removal of the patterned sacrificial material 40a–40d leaves behind several openings or voids, such as opening or void 44. As a result, a number of stacked electrostatic actuator cells are defined between the substrates 30 and 32. One such stacked electrostatic actuator cell is shown at 46.

Figure 17:
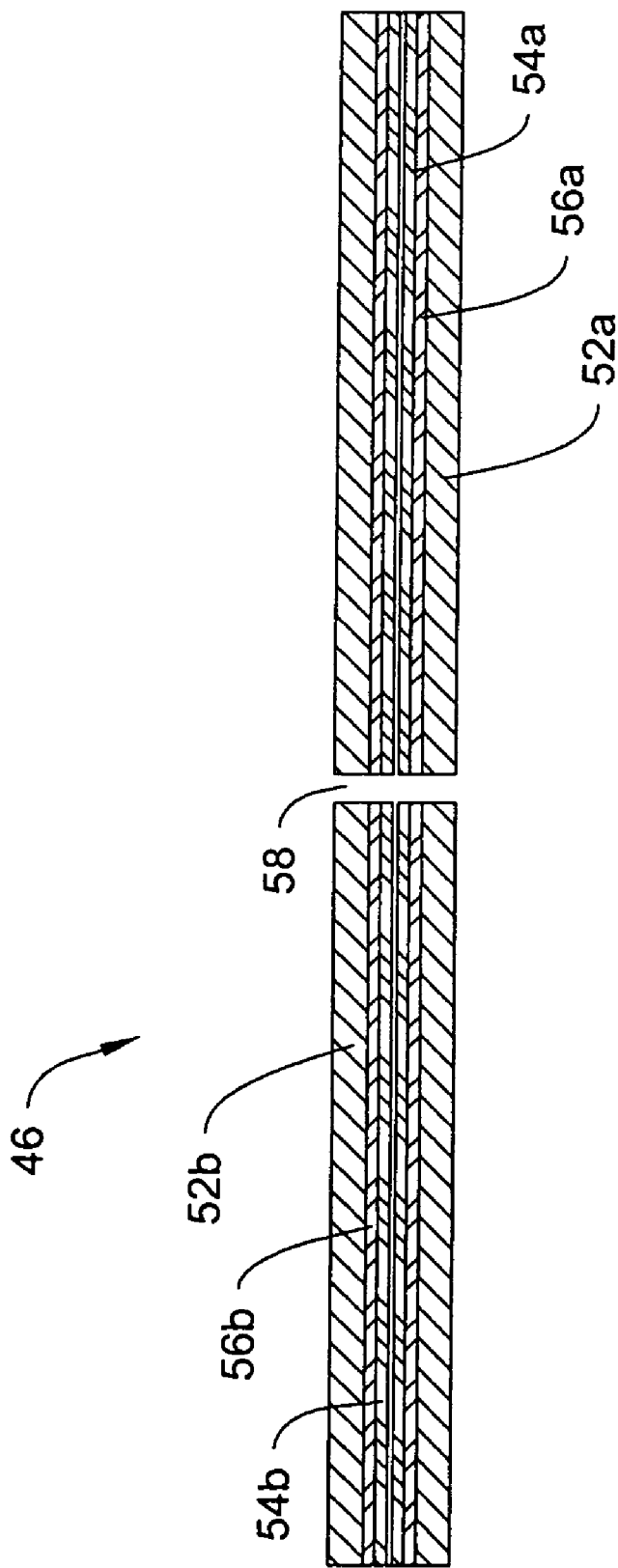
FIG. 17 illustrates a unit cell for an electrostatic actuator array in a closed state.

FIG. 17 shows in more detail the electrostatic actuator unit cell 46 in a closed state. The electrostatic actuator unit cell 46 includes flexible layers 52a and 52b (e.g. device layers), dielectric layers 54a and 54b, and conductive or electrode layers 56a and 56b placed between the dielectric layers 54a and 54b and the flexible layers 52a and 52b. A through hole 58 is also shown. The through hole may be useful in removing the sacrificial layers, as described above, and during actuation, may reduce fluidic drag on movement of the actuator, as further described below.

Figure 18:
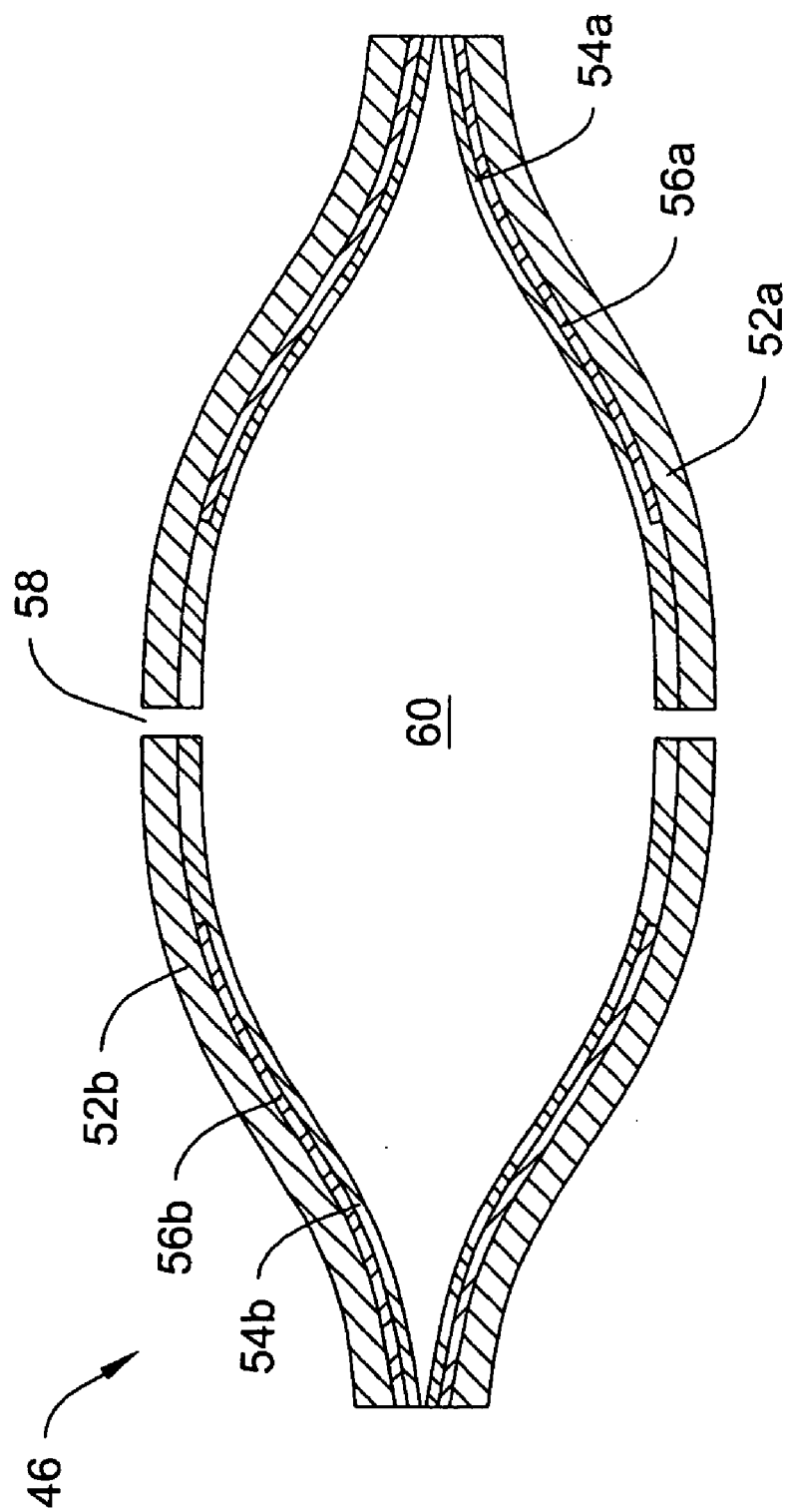
FIG. 18 illustrates a unit cell for an electrostatic actuator array in an expanded state.

FIG. 18 illustrates the unit cell 46 of FIG. 17 in an expanded state. In the illustrative embodiment, the unit cell 46 has been subjected to an expansion force, causing the flexible layers 52a and 52b to become separated to create an expanded cavity 60 therebetween. In the illustrative embodiment, when the cell 46 expands as shown, fluid such as air or other fluid or gas, may fill the cavity 60 by entering the through hole 58. If a voltage is applied between the conductive layers 56a and 56b, an electrostatic attraction force is created between the conductive layers 56a and 56b. When the electrostatic force overcomes the expansion force, the unit cell 50 will close, rolling from the outside of the unit cell 46 toward the center. In some embodiments, the conductive layers 56a and 56b extend all the way across the unit cell as shown in FIG. 17. In other embodiments, and as shown in FIG. 18, the conductive layers only extend over an outer or peripheral portion of the unit cell 50. With this configuration, the unit cell 50 may not completely close, as shown in FIG. 17, but instead may leave the center portion partially open. This may reduce stiction by maintaining a portion of the unit cell 50 in a partially expanded state. This may also reduce stiction by discouraging the creation of charge traps in the dielectric nearer the center of the unit cell 50. Such charge traps may make it more difficult to begin separating the two dielectric layers if both are relatively planar.

Figure 19:
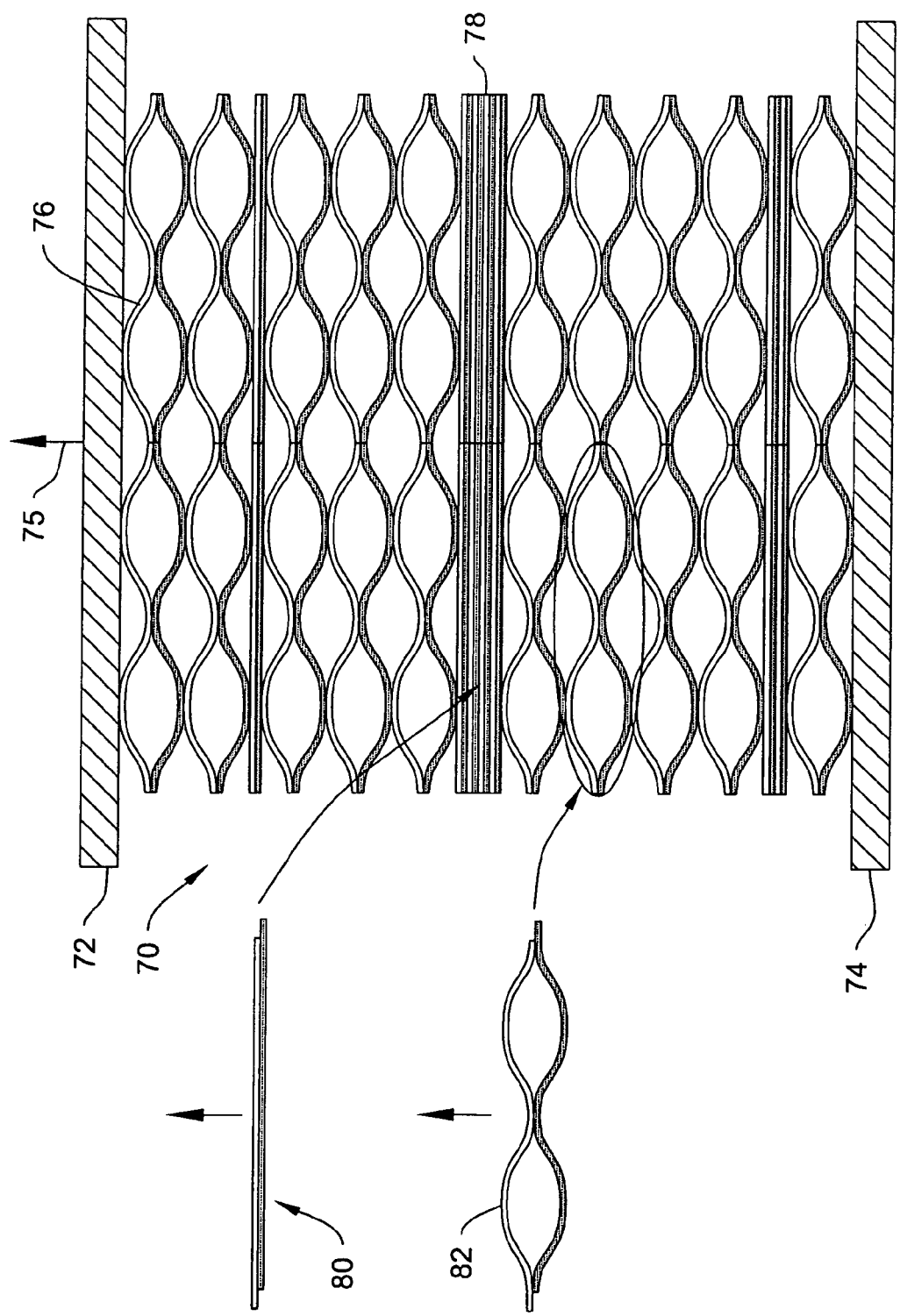
FIG. 19 illustrates the functioning of an electrostatic actuator array.

FIG. 19 shows the functioning of an electrostatic actuation array 70. The array 70 is shown disposed between a first plate 72 and a second plate 74, each of which may be used in forming the array 70, or the plates 72 and/or 74 may receive or otherwise be attached to the substrates used in forming the array 70. In one embodiment, the substrate used in forming the array 70 may be removed and discarded, and the array 70 may be attached to the plates 72 and 74, which may be, for example, too large or made from an unsuitable material, and/or not suitable for use in the fabrication process for the array 70.

A number of unit cells are shown between plates 72 and 74, with some expanded cells 76 and some closed cells 78. As shown in the close-up portions on the left, when a voltage is applied to some cells 80, the cells collapse to a closed state. When the voltage is removed or is below a threshold level, the cells 82 expand, especially under an expanding force 75 that pulls the substrates 72 and 74 apart.

In some embodiments, there is a certain hysteresis to the actuation of the unit cells, because the electrostatic attraction forces are proportional to the distance between the electrodes. Therefore, the voltage needed to maintain a cell in a closed state is typically less than the voltage required to collapse a cell. In operation, and in an illustrative embodiment, the array 70 is first pre-tensioned via expanding force 75 such that there are at least some expanded cells 76 in the array 70. Then one or more voltages are selectively applied to some or all of the unit cells to provide actuation between plates 72 and 74.

In one illustrative embodiment, a polymer is used for the device layers that become the flexible layers of the unit cells. For example, existing polymer blends such as MYLAR® or KAPTON® (both registered trademarks of E.I. du Pont de Nemours & Co., Wilmington, Del.) may be used and adapted to be ink-jet printed. In one embodiment, a polyimide layer of KAPTON® may be used. However, it is contemplated that any suitable material may be used, depending on the application.

To reduce the number of materials used, it is contemplated that the same material may be used for both the device layers and the dielectric layers. For example, a polymer having a high dielectric constant may be used. Alternatively, or in addition, the number of layers may be reduced by, for example, using a conductive material for at least part of the device layers. In this embodiment, the conductive device layer may perform a dual function of a flexible support member and an electrode.

More specifically, one illustrative embodiment may use 5-micron thick polymer (polyimide) layers for the device layers (i.e. as measured between vertically stacked cells), 1-micron thick dielectric layers, 0.1-micron thick conductive layers and 0.3-micron thick sacrificial layers. The conductive layers may be provided by, for example, ink-jet printing using a suspension including nano-particles of gold and/or silver as the ink. In the illustrative embodiment, the sacrificial layers are preferably made from a material that can be selectively removed without disturbing the other layers.

In some embodiments, the selection of a particular ink-jet print head for a particular type of material or "ink" may be desirable. For example, thicker layers typically require more material to be placed at a given location than thinner layers, so a larger nozzle ink-jet print head may be desirable to pass the material or "ink" more quickly. Layers with smaller feature sizes may make use of a smaller ink-jet print head to achieve better resolution. For dielectric layers, an ink jet head that minimizes pinholes may be used, and a printing pattern with significant dot-to-dot overlap may be desired.

In some embodiments, each ink-jet head is included in a separate ink-jet cartridge. In other embodiments, more than one ink-jet head may be included in a single ink-jet cartridge, as desired. If more than one ink-jet head is provided in an ink-jet cartridge, multiple reservoirs may be provided. Each reservoir may contain a different printable material, as appropriate.

In some embodiments, multiple ink-jet heads may be used sequentially to deposit the various materials and/or layers of a micro-structure, while in other embodiments, multiple ink-jet heads may be used simultaneously. When multiple ink-jet head are used simultaneously, the material deposited by one ink-jet head preferably does not overlap the material just deposited by another ink-jet head, as some time may be required for the "ink" to setup or dry. However, this is not required in all embodiments.

It is contemplated that a number of sensors may be provided to detect when the electrodes are brought together and when they are spaced apart. These sensors may be provided in any number of ways, including for example, by ink-jet printing. Other devices, such as transistors, resistors, capacitors, inductors and related circuits may also be ink-jet printed, as desired, and may be used in conjunction with the micro-structures discussed herein.

Knowledge that a cell has or has not collapsed may be useful in a number of ways. For example, once it is determined that a cell has closed, the voltage applied may be reduced to discourage damage in the dielectric layers or to save power, if desired. Alternatively, or in addition, knowing whether a cell has closed can be used to observe or determine whether the actuator is functioning properly. If a cell that is supposed to close does not, the applied voltage may be increased to cause such closure or a different or redundant cell may be selected to replace the mal-functioning cell.

Figure 20:
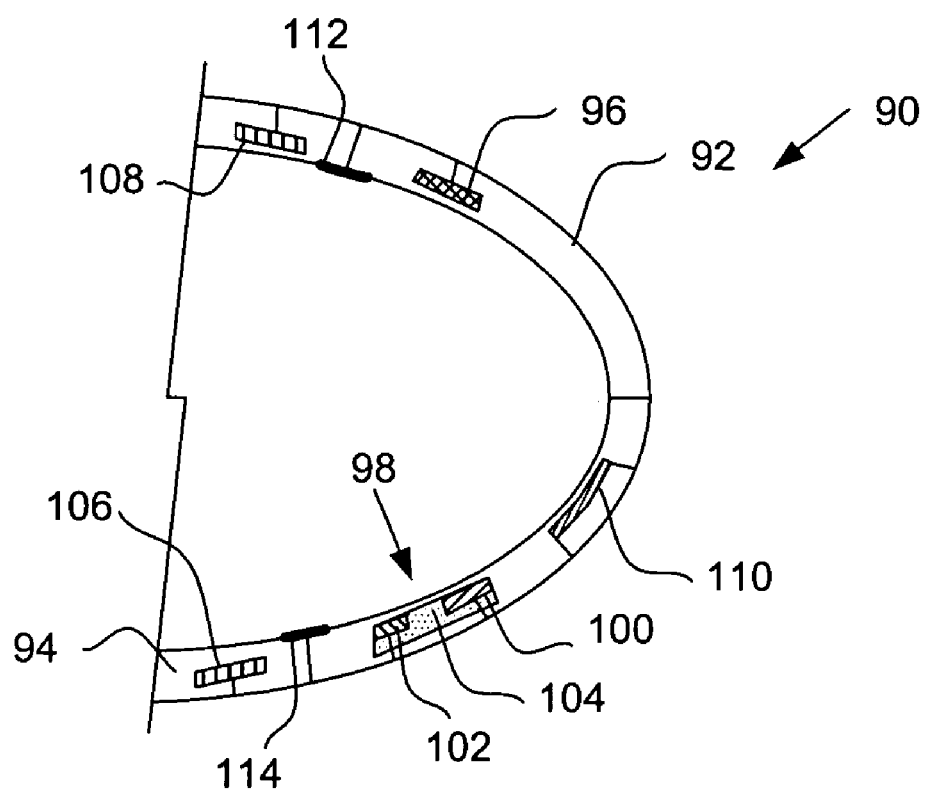
FIGS. 20–21 illustrate a method for providing devices to detect the state of an actuator cell.
Figure 21:
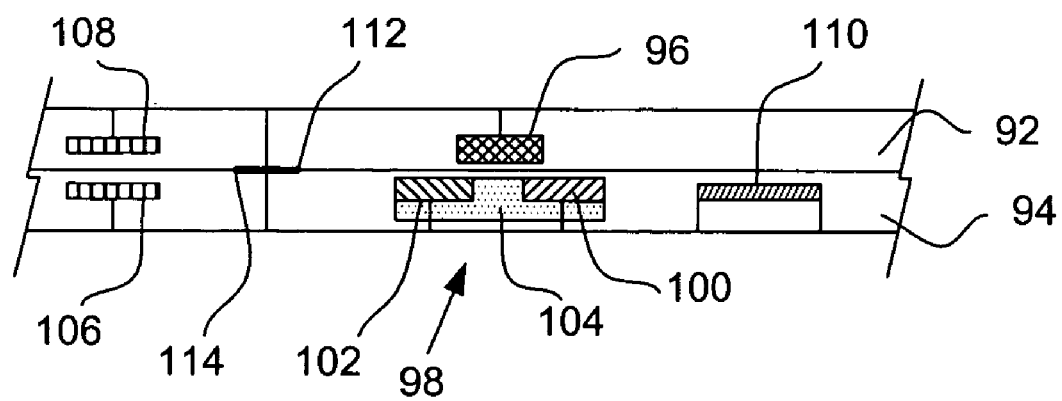

FIGS. 20–21 illustrate several embodiments for detecting the state of an actuating unit cell. A unit cell is shown generally at 90 and includes an upper flexible member 92 and a lower flexible member 94, similar to that described above. Embedded or placed on the upper flexible member 92 is a conductive member or gate 96, which may include a conductive lead, as shown. Embedded or placed on the lower flexible member 94 is a doped or other conductive region 98, which includes a source 100 and a drain 102, with a channel 104 there-between. When a voltage applied between the source 100 and drain 102, current will not flow unless the channel 104 is subjected to a threshold electric field. When the unit cell 90 is in the open configuration, there is no field created in the region of the channel 104, and thus no current flows between the source 100 and drain 102.

When a voltage is applied to the electrodes of the unit cell 90, the upper flexible layer 92 snaps to the lower flexible layer 94, bringing the gate 96 adjacent to the source 100 and the drain 102. When this actuation occurs, a voltage supplied at the gate creates an electric field in the channel 104, thereby allowing current to flow between the source 100 and drain 102, similar to a field effect transistor (FET). Such a field effect transistor may be used to sense whether the cell 90 is in the open or closed position.

A second illustrative embodiment for monitoring whether the cell 90 is in the open or closed state is a capacitive device. In this example, a first electrode 106 and a second electrode 108 may be provided in or on the dielectric 94 on opposing sides of the unit cell 90. The distance between the electrodes 106 and 108 changes when the cell closes, as shown by viewing FIGS. 20 and 21. Because capacitance is related to the distance between the two capacitive electrodes, the capacitor between the electrodes 106 and 108 will change from a first capacitance to a second capacitance when the unit cell 90 closes. The capacitance can be monitored by, for example, observing the frequency response of an RC circuit that includes the capacitor formed by the electrodes 106 and 108. Observing the capacitance (or changes in capacitance) can indicate whether the unit cell 90 is open or closed.

Another illustrative device for monitoring whether a unit cell has closed may include printing a piezo device 110 on a portion of the unit cell 90 that stretches during actuation. For example, a piezoelectric device may be printed in or on the dielectric layer, the flexible layer 94 or any other layer as desired. A conductive trace (or traces) leading to the piezoelectric device may also be provided by ink-jet printing. Because the traces are printed on material that is also provided by ink-jet printing, it is possible to route traces three-dimensionally more easily than with some other processes. If the piezo device 110 is piezoelectric, it will create a varying voltage as the cell opens and closes. If the piezo device 110 is a piezo-resistive device, then the resistance will vary as the cell opens and closes.

Another illustrative embodiment for monitoring whether a unit cell has closed may include a first relay contact 112 on the upper flexible layer 92 and a second relay contact 114 on the lower flexible layer 94. When the cell 90 is in an expanded shape as shown in FIG. 20, the relay contacts 112 and 114 are separated and no current flows therebetween. Once the cell collapses as shown in FIG. 21, the relay contacts may come into contact, allowing current to flow between the relay contacts. The embodiments shown in FIGS. 20–21 are merely illustrative of unit cell opening/closing sensors that may be used. These embodiments may be used separate from one another, or may be combined to provide multiple sensors, if desired.

Figure 22:
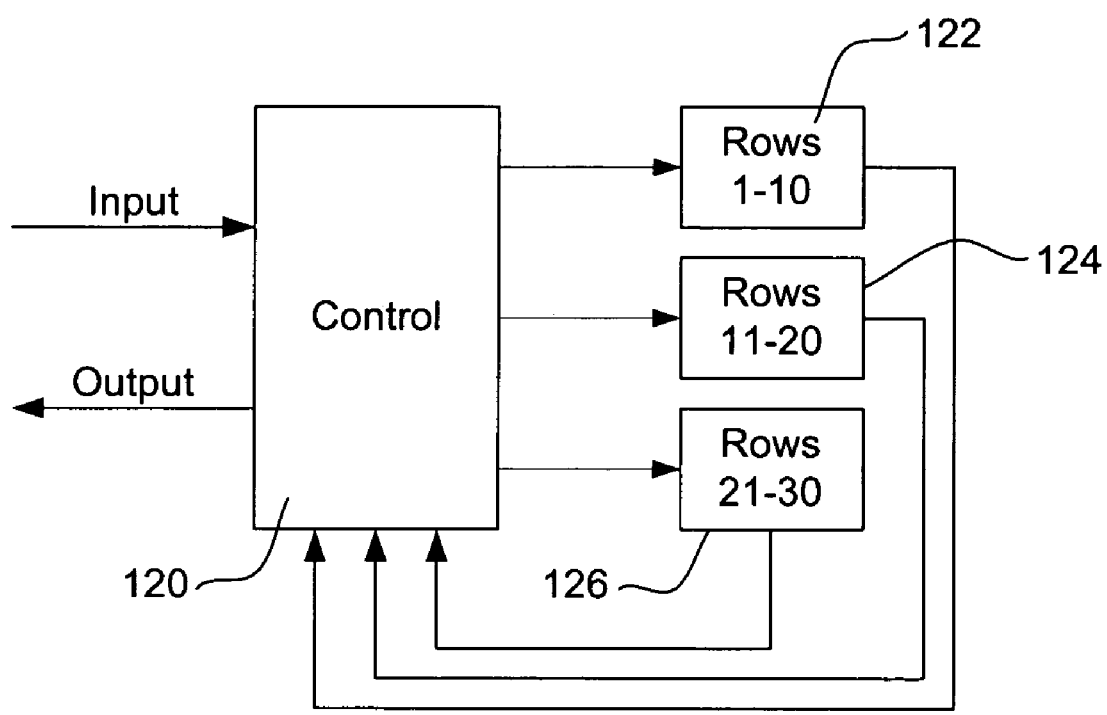
FIG. 22 shows an illustrative control scheme for an electrostatic array.

It is contemplated that the knowledge of whether a particular cell is opened or closed may also be used to control the voltages that are applied to other cells. FIG. 22 shows an illustrative block diagram for a controller of an electrostatic actuator array. An input to a control block 120 may be a signal calling for an actuator to contract gradually or smoothly. The control block 120 may be provided, for example, by printing a logic circuit on, within, or adjacent to an actuation array. In the illustrative embodiment, the control block 120 provides a control voltage to a first row block 122 of unit cells. This may cause, for example, a first set of ten rows of unit cells to close. Once the control block 120 receives a signal indicating that the rows in the first row block 122 have closed, the control block 120 may send a signal to a second row block 124, causing a second set of ten rows to close. After the control block 120 receives a signal indicating that the rows in the second row block 124 have closed, the control block 120 may send another signal to close the rows in a third row block 126.

In some cases, when an actuation voltage is applied to all a group of the cells (e.g. rows), some of the cells may immediately close while others may not. The cells that immediately close may not contribute significantly to actuation of the overall actuator, but rather may simply cause the device layers of adjacent cells to flex further. In some cases, it may be desirable to increase the actuation voltage to only those cells that have not immediately closed, and possibly reduce the actuation voltage to those cells that have already closed.

The control block 120 may also send back a signal indicating the status of the rows controlled by the control block 120. In some embodiments, a sequence of row closing signals sent by the control block 120 may simply be a timed sequence, rather than waiting for signals indicating that the rows have closed.

It is also contemplated that additional layers of material may be deposited for the purpose of improving device performance and/or properties. A simple example may include providing an adhesive between layers of dissimilar materials. For example, polyimide materials, while strong and flexible and thus suitable for forming the flexible device layers, may not adhere well to certain other materials such as certain conductive or dielectric materials. In order to improve adhesion with the polyimide materials, a tie layer may be provided (including by ink-jet printing) between the polyimide materials and the other conductive or dielectric layers, if desired. Likewise, a number of adhesion-improving curing techniques may be used, for example, post-processing ultraviolet light exposures, anneals, or other treatments, as desired.

Those skilled in the art will recognize that the present invention may be manifested in a variety of forms other than the specific embodiments described herein. Accordingly, departures in form and detail may be made without departing from the scope and spirit of the present invention as described in the appended claims.

What is claimed is:

1. A method of forming a structure, comprising the steps of:
    ink-jet printing a first layer;
    ink-jet printing a first sacrificial layer above at least part of the first layer;
    ink-jet printing a second layer above at least part of the first sacrificial layer; and
    removing the first sacrificial layer to create at least one first open space within the structure.

2. The method of claim 1 further comprising the step of ink-jet printing a first electrode layer prior to ink-jet printing the first sacrificial layer, wherein the first sacrificial layer extends above at least part of the first electrode layer.

3. The method of claim 2 further comprising the step of ink-jet printing a first dielectric layer above the first electrode layer prior to ink-jet printing the first sacrificial layer, wherein the first sacrificial layer extends above at least part of the first dielectric layer.

4. The method of claim 3 further comprising the step of ink-jet printing a second dielectric layer above the first sacrificial layer prior to ink-jet printing the second layer, wherein the second dielectric layer extends above at least part of the first sacrificial layer.

5. The method of claim 4 further comprising the step of ink-jet printing a second electrode layer above the second dielectric layer prior to ink-jet printing the second layer, wherein the second electrode layer extends above at least part of the second dielectric layer.

6. The method of claim 5 further comprising the steps of:
    ink-jet printing a second sacrificial layer above at least part of the second layer, ink-jet printing a third layer above at least art of the second sacrificial layer; and
    removing the second sacrificial layer to create at least one second open space within the structure.

7. The method of claim 6 further comprising the step of ink-jet printing a third electrode layer prior to ink-jet printing the second sacrificial layer, wherein the second sacrificial layer extends above at least part of the third electrode layer.

8. The method of claim 7 further comprising the step of ink-jet printing a third dielectric layer above the third electrode layer prior to ink-jet printing the second sacrificial layer, wherein the second sacrificial layer extends above at least part of the third dielectric layer.

9. The method of claim 8 further comprising the step of ink-jet printing a fourth dielectric layer above the second sacrificial layer prior to ink-jet printing the third layer, wherein the fourth dielectric layer extends above at least part of the second sacrificial layer.

10. The method of claim 9 further comprising the step of ink-jet printing a fourth electrode layer above the fourth dielectric layer prior to ink-jet priming the third layer, wherein the fourth electrode layer extends above at least part of the fourth dielectric layer.

11. The method of claim 6 wherein the third layer is flexible.

12. The method of claim 6 wherein the second sacrificial layer is a patterned layer having second sacrificial layer regions, wherein the second sacrificial layer regions are spaced by gaps and the third layer is secured to the second layer in the gaps.

13. The method of claim 12 wherein the gaps between the second sacrificial layer regions are offset relative to the gaps in the first sacrificial layer regions.

14. The method of claim 6 wherein the first sacrificial layer and the second sacrificial layer are removed at the same time.

15. The method of claim 14 further comprising the step of providing through holes that intersect the first sacrificial layer and the second sacrificial layer prior to removing the first sacrificial layer and the second sacrificial layer.

16. The method of claim 1 wherein the first layer and the second layer are flexible.

17. The method of claim 1 wherein the first sacrificial layer is a patterned layer having first sacrificial layer regions, wherein the first sacrificial layer regions are spaced by gaps and the first layer is secured to the second layer in the gaps.

18. The method of claim 1 wherein the structure is an electrostatic actuator.

19. A method of forming a structure, comprising the steps of:
    ink-jet printing a first flexible layer of polymeric material;
    ink-jet printing a first sacrificial layer above at least part of the first flexible layer;
    ink-jet printing a second flexible layer of polymeric material above at least part of the first sacrificial layer; and
    removing the first sacrificial layer to create at least one open space or cavity between said first and second flexible layers.

20. A method of forming a structure, comprising the steps of:
    ink-jet printing a first device layer;
    ink-jet printing a first electrode layer;
    ink-jet printing a first dielectric layer;
    ink-jet printing a first sacrificial layer above at least part of the first dielectric layer;
    ink-jet printing a second device layer above at least part of the first sacrificial layer; and
    removing the first sacrificial layer to create at least one open space within the structure.

* * * * *